US008879035B2

(12) United States Patent
Chen

(10) Patent No.: US 8,879,035 B2
(45) Date of Patent: Nov. 4, 2014

(54) LIQUID CRYSTAL DISPLAY DEVICE, COLOR-FILTER SUBSTRATE, THIN-FILM-TRANSISTOR SUBSTRATE AND MANUFACTURING METHOD THEREOF

(75) Inventor: Shyh-feng Chen, Shenzhen (CN)

(73) Assignee: Shenzhen China Star Optoelectronics Technology Co., Ltd., Shenzhen (TW)

( * ) Notice: Subject to any disclaimer, the term of this patent is extended or adjusted under 35 U.S.C. 154(b) by 68 days.

(21) Appl. No.: 13/375,638

(22) PCT Filed: Jul. 29, 2011

(86) PCT No.: PCT/CN2011/077768
§ 371 (c)(1),
(2), (4) Date: Dec. 1, 2011

(87) PCT Pub. No.: WO2012/151792
PCT Pub. Date: Nov. 15, 2012

(65) Prior Publication Data
US 2012/0287363 A1 Nov. 15, 2012

(30) Foreign Application Priority Data
May 9, 2011 (CN) .......................... 2011 1 0118572

(51) Int. Cl.
G02F 1/1343 (2006.01)
G02F 1/133 (2006.01)
G02F 1/136 (2006.01)
G09G 3/04 (2006.01)
G02F 1/1362 (2006.01)
H01L 27/12 (2006.01)

(52) U.S. Cl.
CPC ............. *G02F 1/134336* (2013.01); *G02F 2001/136218* (2013.01); *H01L 27/1259* (2013.01); *G02F 2201/121* (2013.01); *G02F 1/1362* (2013.01)
USPC ............ 349/139; 349/33; 349/43; 345/33; 345/48; 345/50

(58) Field of Classification Search
None
See application file for complete search history.

(56) References Cited

U.S. PATENT DOCUMENTS

| 6,650,389 B1* | 11/2003 | Sakamoto ..................... 349/141 |
| 6,933,995 B2* | 8/2005 | Fujibayashi et al. ......... 349/113 |
| 7,453,535 B2* | 11/2008 | Sumi ............................ 349/110 |
| 2002/0047973 A1* | 4/2002 | Matsumoto .................. 349/141 |
| 2007/0200990 A1* | 8/2007 | Hirosawa et al. ............ 349/129 |
| 2009/0279027 A1* | 11/2009 | Nishida ........................ 349/114 |

FOREIGN PATENT DOCUMENTS

JP   2009-276588   11/2009

* cited by examiner

*Primary Examiner* — Bumsuk Won
*Assistant Examiner* — Angela Davison
(74) *Attorney, Agent, or Firm* — Muncy, Geissler, Olds & Lowe, P.C.

(57) ABSTRACT

The present invention provides a liquid crystal display device, a color-filter substrate, a thin-film-transistor substrate and a manufacturing method thereof. The thin-film-transistor substrate has a pixel array and transparent conductive material. The pixel array has a plurality of thin-film-transistor units, pixel electrodes and metal signal lines. The transparent conductive material is mounted on the pixel array with an insulating layer placed therebetween, and correspondingly covers an area containing the thin-film-transistor units and the metal signal lines. And voltage difference between the transparent conductive layer and a common electrode of the color-filter substrate is smaller than a threshold voltage of liquid crystal cell. Therefore, without enough voltage difference for driving, the liquid crystal material between the transparent conductive material and the common electrode can maintain at a vertical status to block lights, so as to replace the function of traditional black matrix.

4 Claims, 6 Drawing Sheets

LIQUID CRYSTAL DISPLAY DEVICE, COLOR-FILTER SUBSTRATE, THIN-FILM-TRANSISTOR SUBSTRATE AND MANUFACTURING METHOD THEREOF

CROSS-REFERENCE TO RELATED APPLICATIONS

This application is the National Stage of International Application No. PCT/CN2011/077768 filed Jul. 29, 2011, which claims the benefit of Chinese Application No. 201110118572.6, filed May 9, 2011, the disclosures of which are incorporated herein by reference in their entireties.

FIELD OF THE INVENTION

The present invention relates to a liquid crystal display device, and more particularly to a liquid crystal display device, a color-filter substrate, a thin-film-transistor substrate and a manufacturing method thereof capable of saving steps of manufacturing process.

BACKGROUND OF THE INVENTION

Conventional TFT-LCD (Thin film transistor liquid crystal display) mainly includes two glass substrates and a liquid crystal layer, wherein the upper glass substrate has a color filter mounted on its surface and the lower glass substrate has thin film transistors and pixel electrodes mounted thereon. The color filter includes color photoresists and a black matrix. The color photoresists corresponds to the pixel electrodes in position. The black matrix is formed between the color photoresists. Generally speaking, the black matrix is usually formed on the surface of the upper glass substrate through steps of coating, developing, and exposure.

Foregoing black matrix is indispensable for the color filters of the conventional TFT-LCDs. As for a vertical alignment type TFT-LCD, liquid crystal is in a vertical status that block lights while not being controlled by any electric field, therefore the entire screen goes black without light leakage. But when the pixel electrodes is driven by voltages, metal wires that connect the pixel electrodes will change the angle of the liquid crystal thereon because of transferring the voltages signals, and then leads to a light leakage problem. Therefore, the black matrix is used to correspondingly shelter the metal wires surrounding the pixel electrodes so as to avoid the light leakage problem.

Therefore, current TFT-LCD manufacturing process inevitably requires a process for forming the black matrix. If the TFT-LCD manufacturing process can save the process for forming the black matrix while accomplishing an object of avoiding the light leakage problem, manufacturing cost will be reduced and production efficiency will be enhanced.

Hence, it is necessary to provide a liquid crystal display device, a color-filter substrate, a thin-film-transistor substrate and a manufacturing method thereof to overcome the problems existing in the conventional technology.

SUMMARY OF THE INVENTION

An object of the invention is to provide a liquid crystal display device, a color-filter substrate, a thin-film-transistor substrate and a manufacturing method thereof to save a process of making black matrix.

In order to achieve the foregoing object, the present invention provides a liquid crystal display device having: a color-filter substrate having a common electrode; a thin-film-transistor substrate disposed under the color-filter substrate and having a pixel array and transparent conductive material, wherein the pixel array has a plurality of thin-film-transistor units, a plurality of pixel electrodes and a plurality of metal signal lines; the transparent conductive material is disposed upon the pixel array with a protection layer placed therebetween, and correspondingly covers an area containing the thin-film-transistor units and the metal signal lines; and voltage difference between the transparent conductive material and the common electrode is smaller than a threshold voltage of liquid crystal cell; and a liquid crystal layer mounted between the thin-film-transistor substrate and the color-filter substrate.

In one embodiment of the present invention, the thin-film-transistor substrate includes a lower glass substrate, and the pixel array is formed on a surface of the lower glass substrate; and the color-filter substrate includes an upper glass substrate and a color photoresist layer, and the color photoresist layer is formed on a surface of the upper glass substrate and the common electrode is mounted on the color photoresist layer.

In one embodiment of the present invention, the metal signal lines includes multiple scan lines and multiple signal lines, and each of the scan lines and each of the signal lines are crossed perpendicularly with each other; a gate and a source of each of the thin-film-transistor units are respectively connected to one of the scan lines and one of the signal lines, and a drain thereof is connected to one of the pixel electrodes.

In one embodiment of the present invention, the transparent conductive material correspondingly covers the scan lines or the signal lines or concurrently covers the scan lines and the signal lines.

In one embodiment of the present invention, the transparent conductive material and the common electrode are at the same electric potential.

The present invention further provides a thin-film-transistor substrate, and the thin-film-transistor substrate is to be disposed under a color-filter substrate that does not have black matrix, and has a lower glass substrate, a pixel array and a transparent conductive material, and the pixel array is formed on a surface of the lower glass substrate and has a plurality of thin-film-transistor units, pixel electrodes and metal signal lines; the transparent conductive material is mounted upon the pixel array with a protection layer placed therebetween, and correspondingly covers an area containing the thin-film-transistor units and the metal signal lines, and voltage difference between the transparent conductive material and a common electrode of the color-filter substrate is smaller than a threshold voltage of liquid crystal cell.

In one embodiment of the present invention, the metal signal lines includes multiple scan lines and multiple signal lines, and each of the scan lines and each of the signal lines are crossed perpendicularly with each other; a gate and a source of each of the thin-film-transistor units are respectively connected to one of the scan lines and one of the signal lines, and a drain thereof is connected to one of the pixel electrodes.

In one embodiment of the present invention, the transparent conductive material correspondingly covers the scan lines or the signal lines or concurrently covers the scan lines and the signal lines.

In one embodiment of the present invention, the transparent conductive material and the common electrode are at the same electric potential.

In one embodiment of the present invention, each of the pixel electrodes corresponds to a red, a green or a blue photoresist of a color photoresist layer of the color-filter substrate.

The present invention further provides a color-filter substrate for being disposed upon the foregoing thin-film-transistor substrate and having an upper glass substrate, a color photoresist layer and a common electrode, and the color photoresist layer is formed on a surface of the upper glass substrate and comprises red, green and blue photoresists, and the color-filter substrate does not have black matrix disposed on positions corresponding to the transparent conductive material; and the common electrode is formed on the color photoresist layer.

The present invention further provides a manufacturing method of thin-film-transistor substrate, having steps of: providing a lower glass substrate; concurrently forming a plurality of scan lines and gates of thin-film-transistor units on a surface of the lower glass substrate; forming an insulating layer on the surface of the lower glass substrate and forming semiconductor layers of the thin-film-transistor units on the insulating layer on positions corresponding to the gates of the thin-film-transistor units; forming a plurality of signal lines upon the surface of the upper glass substrate and concurrently forming sources and drains of the thin-film-transistor units on positions corresponding to the semiconductor layers of the thin-film-transistor units, wherein the signal lines and the scan lines are perpendicularly crossed with each other; forming a first protection layer on the insulating layer and the thin-film-transistor units and etching the first protection layer on positions corresponding to the drains of the thin-film-transistor units to expose the drains of the thin-film-transistor units; forming pixel electrodes on a surface of the first protection layer that the pixel electrodes correspondingly join the drains of the thin-film-transistor units; forming second protection layer on positions corresponding to the thin-film-transistor units, the scan lines and the signal lines; and forming transparent conductive material on the second protection layer on positions corresponding to the thin-film-transistor units, the scan lines and the signal lines.

In one embodiment of the present invention, the semiconductor layer includes an un-doped amorphous silicon layer and a doped amorphous silicon layer.

In one embodiment of the present invention, the pixel electrodes and the transparent conductive material are Indium Tin Oxide.

In one embodiment of the present invention, the insulating layer, the first protection layer and the second protection layer are silicon nitride.

The present invention primarily makes transparent conductive material on an area having no pixel electrodes and makes the transparent conductive material and a common electrode on a color filter thereof to be at the same electric potential, so as to prevent liquid crystal therebetween from twisting and leading to light leakage, so that the function of black matrix can be replace and the manufacturing process for black matrix can be omitted.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

Figure 1:
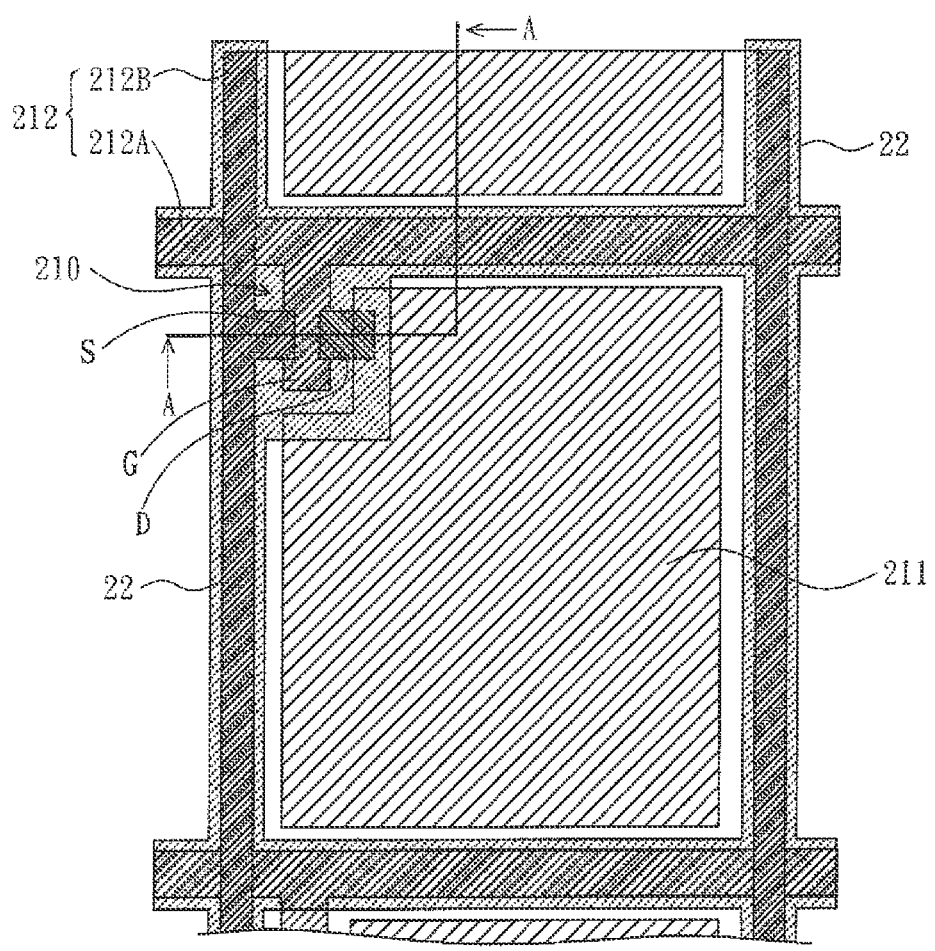
FIG. 1 is a partial plan view of a first embodiment of a liquid crystal display device in accordance with the present invention.
Figure 2:
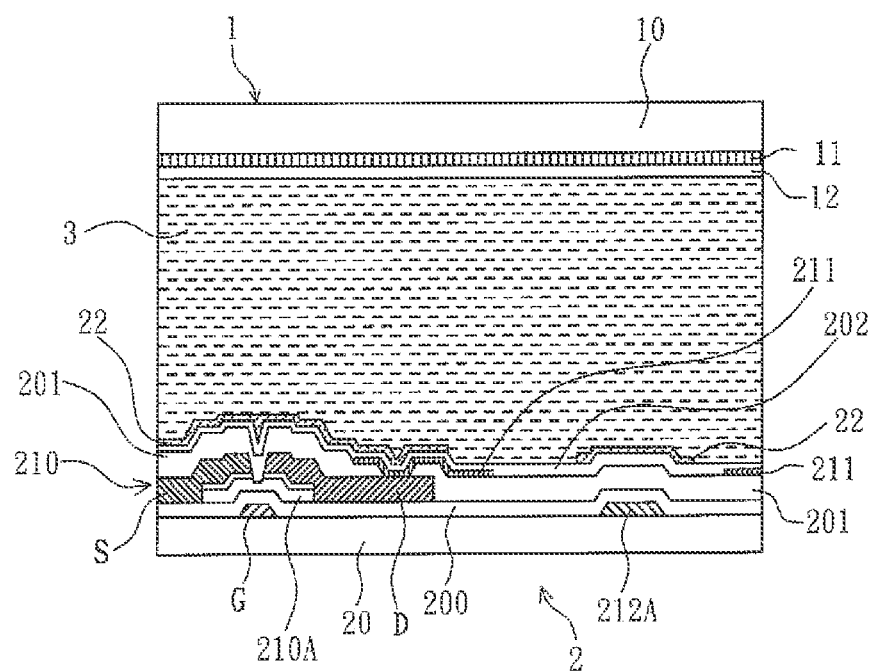
FIG. 2 is a cross-sectional view along the line AA in FIG. 1.

With reference to FIG. 1 and FIG. 2, FIG. 1 is a partial plan view of a first embodiment of a liquid crystal display device in accordance with the present invention and FIG. 2 is a cross-sectional view along the line AA in FIG. 1.

A liquid crystal display device comprises a color-filter substrate 1, a thin-film-transistor substrate 2 and a liquid crystal layer 3.

The color-filter substrate 1 comprises an upper glass substrate 10, a color photoresist layer 11 and a common electrode 12. The color photoresist layer 11 is mounted on a surface of the upper glass substrate 10 and has well-arranged red, green and blue photoresists, wherein the red, green and blue photoresists are deposited on the surface of the upper glass substrate 10 via steps of coating, exposure and developing. It is to be noted that, in this embodiment, the color-filter substrate 1 does not contain black matrix. The common electrode 12 is transparent conductive film, deposited on the color photoresist layer 11. The common electrode 12 is preferably Indium Tin Oxide. The aforementioned color photoresist layer 11 that contains red, green, blue photoresists is only for describing the present invention, but the present invention is not limited thereto. Different manners of combination or different arrangement for the color photoresist layer 11 are implementable in the present invention.

The thin-film-transistor substrate 2 is disposed under the color-filter substrate 1 and includes a lower glass substrate 20, a pixel array and a transparent conductive material 22. The pixel array is formed on a surface of the lower glass substrate 20 and has a plurality of thin-film-transistor units 210, pixel electrodes 211 and metal signal lines 212. Each of the thin-film-transistor units 210 has a semiconductor layer 210A, a gate G, a source S and a drain D. Each of the pixel electrodes 211 corresponds to a red, a green or a blue photoresist of the color photoreisist layer 11 of the color-filter substrate 1, and the pixel electrodes 211 is preferably made of Indium Tin Oxide. The metal signal lines 212 contain a plurality of scan lines 212A and a plurality of signal lines 212B. Each of the scan lines 212A and each of the signal lines 212B are crossed perpendicularly with each other, wherein the gate G and the source S of each of the thin-film-transistor units 210 are correspondingly connected to one of the scan lines 212A and one of the signal lines 212B, respectively. The transparent conductive material 22 is mounted on the pixel array with a second protection layer 202 placed therebetween, and correspondingly covers an area containing the thin-film-transistor units 210 and the metal signal lines 212. While covering the metal signal lines 212, the transparent conductive material 22 may correspondingly covers the scan lines 212A or the signal lines 212B or concurrently covers the scan lines 212A and the signal lines 212B. In this embodiment, the transparent conductive material 22 correspondingly and concurrently covers the scan lines 212A and the signal lines 212B. Furthermore, voltage difference between the transparent conductive material 22 and the common electrode 12 is smaller than a threshold voltage of liquid crystal cell, wherein the threshold voltage means the minimum voltage while liquid crystal cell is capable of twisting. In this embodiment, the transparent conductive material 22 is preferably at the same electric potential with the common electrode 12. In other words, the voltage difference between the transparent conductive material 22 and the common electrode 12 is zero. In this embodiment, the second protection layer 202 between the transparent conductive material 22 and the pixel array is used to prevent the pixel electrodes 211 or the metal signal lines 212 from being electrically joining the transparent conductive material 22. Besides, the transparent conductive material 22 is preferably made of Indium Tin Oxide.

The liquid crystal layer 3 is mounted between the thin-film-transistor substrate 2 and the color-filter substrate 1 and comprises liquid crystal materials.

Since the voltage difference between the transparent conductive material 22 and the common electrode 12 is smaller than the threshold voltage of the liquid crystal cell, the liquid crystal material of the liquid crystal layer 3 between the transparent conductive material 22 and the common electrode 12 will not be driven to twist without enough voltage. The liquid crystal material of the liquid crystal layer 3 can maintain a vertical status to prevent lights from passing through the area of the thin-film-transistor units 210 and the metal signal lines 212. Therefore, the present invention can still accomplish an effect of avoiding the light leakage problem under a situation of not using black matrix. And therefore, the color-filter substrate 1 does not have black matrix on positions corresponding to the transparent conductive layer.

Figure 3A:
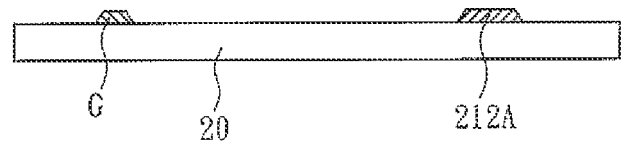
FIG. 3A to FIG. 3G are flow charts of a preferred embodiment of a method of manufacturing a thin-film-transistor substrate of the liquid crystal display device of the present invention.
Figure 3B:
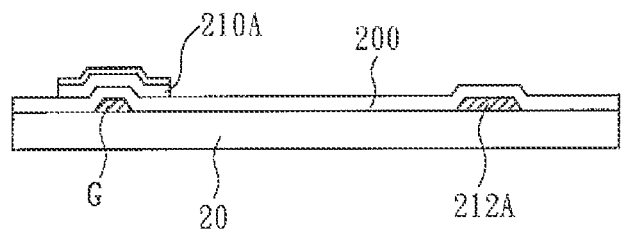
Figure 3C:
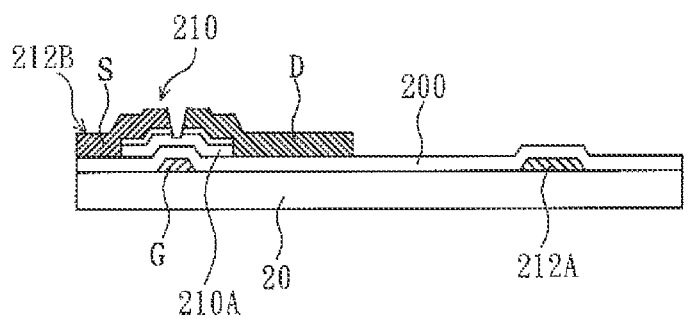
Figure 3D:
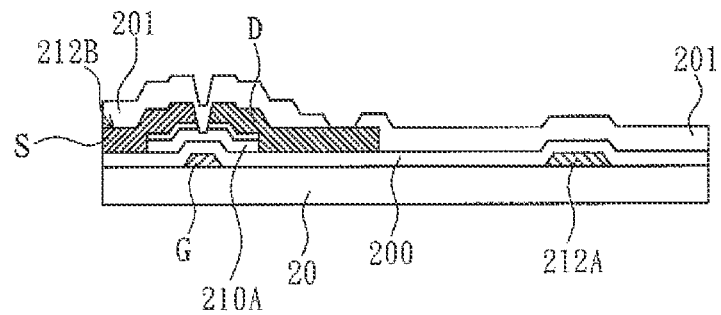
Figure 3E:
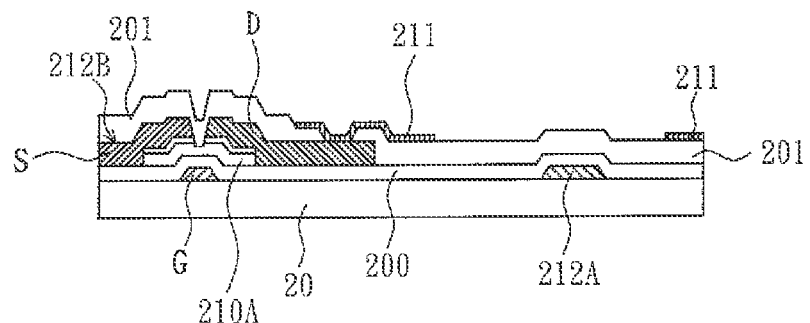
Figure 3F:
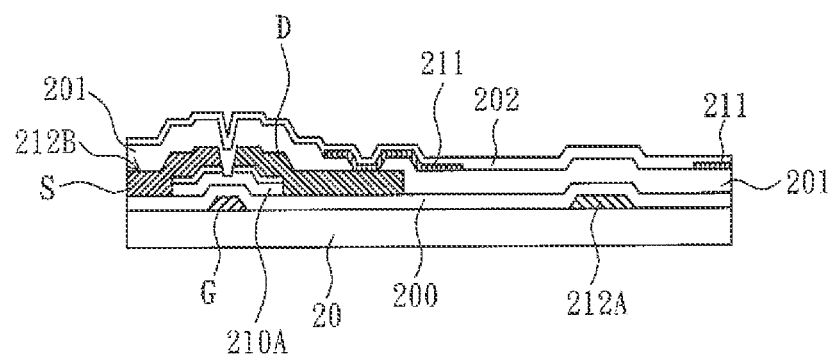
Figure 3G:
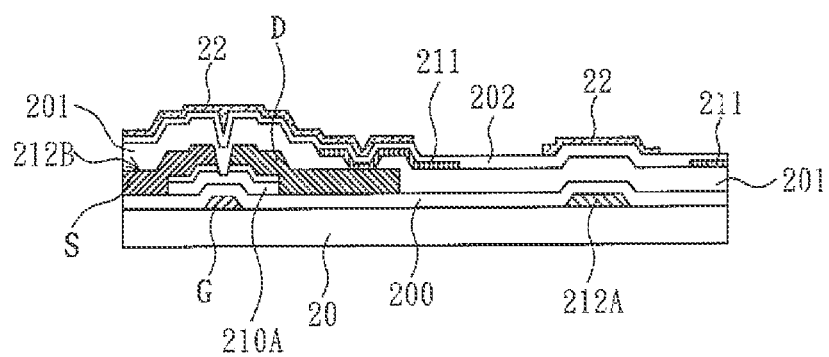

With further reference to FIGS. 3A~3G, FIGS. 3A~3G are flow charts of a preferred embodiment of a method of manufacturing a thin-film-transistor substrate of the liquid crystal display device of the present invention and comprises following steps of:

providing a lower glass substrate 20;

concurrently depositing a plurality of scan lines 212A and gates G of thin-film-transistor units 212 shown in the forgoing FIG. 2 on a surface of the lower glass substrate 20 via steps of metal sputtering coating, exposure and developing, as shown in FIG. 3A;

depositing an insulating layer 200 on the surface of the lower glass substrate 20 and depositing semiconductor layers 210A of the thin-film-transistor units on the insulating layer 200 on positions corresponding to the gates G of the thin-film-transistor units 210, as shown in FIG. 3B; the material of the insulating layer 200 is preferably silicon nitride (SiNx), and the semiconductor layer 210A preferably includes an un-doped amorphous silicon layer and a doped amorphous silicon layer;

depositing a plurality of signal lines 212B upon the surface of the lower glass substrate 20 and concurrently depositing sources S and drains D of the thin-film-transistor units 210 on positions corresponding to the semiconductor layers 210A of the thin-film-transistor units via steps of metal sputtering coating, exposure and developing, as shown in FIG. 3C, wherein the signal lines 212B and the scan lines 212A are perpendicularly crossed with each other;

depositing a first protection layer 201 on the insulating layer 200 and the thin-film-transistor units and etching the first protection layer 201 on positions corresponding to the drains D of the thin-film-transistor units to expose the drains D, as shown in FIG. 3D; the material of the first protection layer 201 is preferably silicon nitride (SiNx);

depositing pixel electrodes 211 on a surface of the first protection layer 201 that the pixel electrodes 211 correspondingly join the drains D of the thin-film-transistor units 210, as shown in FIG. 3E; and the material of the pixel electrodes 211 is preferably Indium Tin Oxide (ITO);

depositing a second protection layer 202 on positions corresponding to the thin-film-transistor units, the scan lines 212A and the signal lines 212B; and the material of the second protection layer 202 is preferably silicon nitride (SiNx); and depositing transparent conductive material 22 on the second protection layer 202 on positions corresponding to the thin-film-transistor units, the scan lines 212A and the signal lines 212B, as shown in FIG. 3G. The material of the transparent conductive material 22 is preferably Indium Tin Oxide (ITO).

Figure 4:
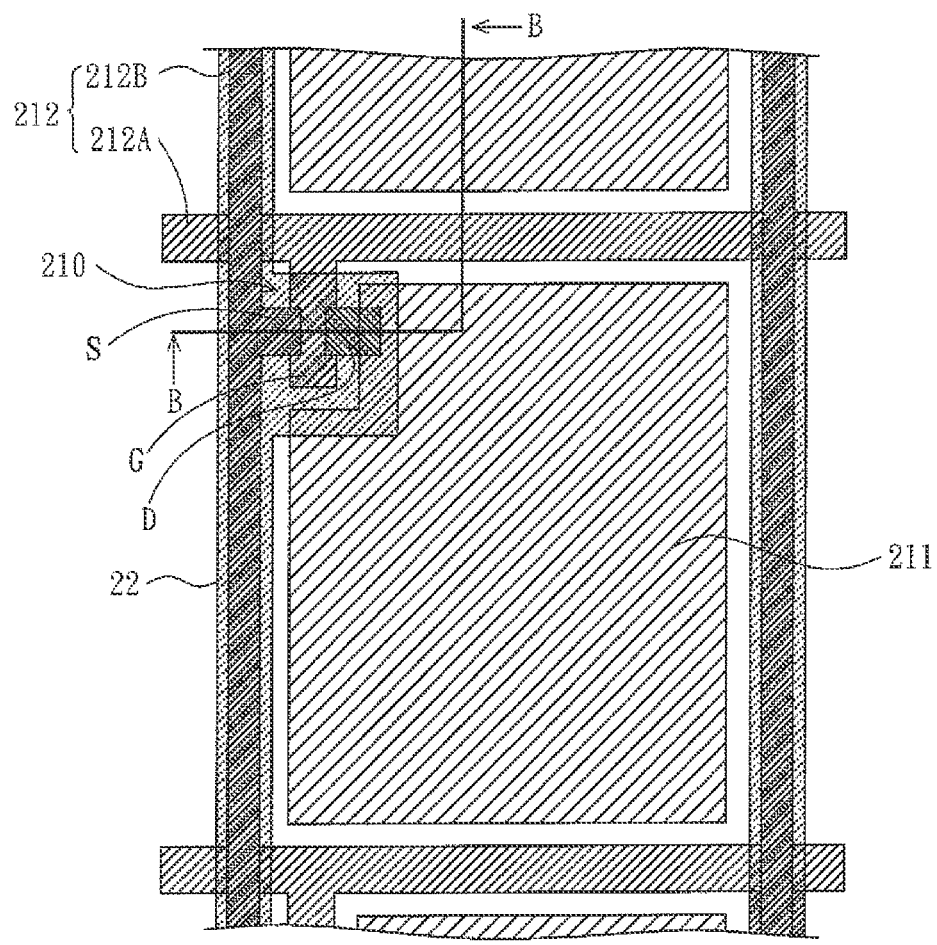
FIG. 4 is a partial plan view of a second embodiment of the liquid crystal display device in accordance with the present invention.
Figure 5:
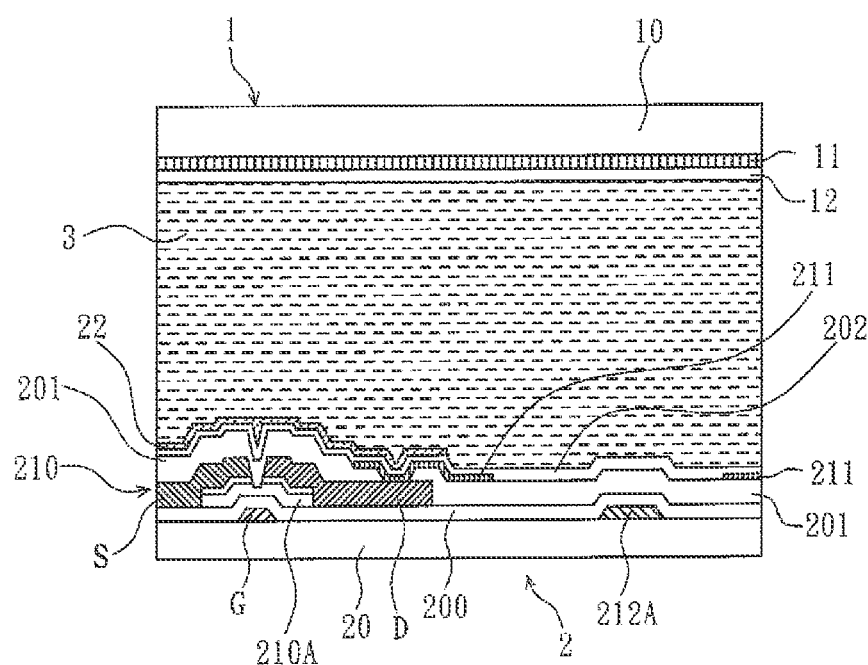
FIG. 5 is a cross-sectional view along the line BB in FIG. 4.

With reference to FIGS. 4 and 5, FIG. 4 is a partial plan view of a second embodiment of the liquid crystal display device in accordance with the present invention, and FIG. 5 is a cross-sectional view along the line BB in FIG. 4. The liquid crystal display device of the second embodiment of the present invention is similar to the first embodiment of the present invention, so as to use similar terms and numerals of the first embodiment, but the difference of the second embodiment is characterized in that: when covering the metal signal lines 212, the transparent conductive material 22 only correspondingly covers the signal lines 212B. But the present invention is not limited thereto, in those embodiments that describing the present invention, the transparent conductive material covering all the metal signal lines, or the transparent conductive material covering parts of the metal signal lines can be within the scope of the present invention.

In conclusion, the present invention is mainly to formed transparent conductive material on the area outside the pixel electrodes on the thin-film-transistor substrate, and concurrently makes the voltage difference between the transparent conductive material and the above common electrode of the color-filter substrate to be smaller than the threshold voltage of liquid crystal cell. Thus, the liquid crystal material in the area outside the electrodes will not be driven to twist and change its arrangement without enough voltage, so as to prevent light leakage from occurring, and thereby to replace the function of black matrix. Hence, the present invention can omit the manufacturing process of black matrix and further to lower manufacturing cost.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A liquid crystal display device, comprising:
   a color-filter substrate having a common electrode, wherein the color-filter substrate is provided with no black matrix;
   a thin-film-transistor substrate disposed under the color-filter substrate and having a pixel array and transparent conductive material, wherein the pixel array has a plurality of thin-film-transistor units, a plurality of pixel electrodes and a plurality of metal signal lines; the transparent conductive material is disposed upon the pixel array in a direction from the thin-film-transistor substrate to the color-filter substrate with a protection layer placed therebetween; and a liquid crystal layer mounted between the thin-film-transistor substrate and the color-filter substrate and comprising liquid crystal materials, wherein the transparent conductive material correspondingly covers an area containing the thin-film-transistor units and the metal signal lines in a direction from the thin-film-transistor substrate to the color-filter substrate, and the transparent conductive material and the common electrode are at the same electric potential, wherein the transparent conductive material remains at the same electric potential while the liquid crystal materials within an area of the electrode pixels are driven to twist.

2. The liquid crystal display device as claimed in claim 1, wherein the thin-film-transistor substrate includes a lower glass substrate, and the pixel array is formed on a surface of the lower glass substrate; and the color-filter substrate includes an upper glass substrate and a color photoresist layer, and the color photoresist layer is formed on a surface of the upper glass substrate and the common electrode is mounted on the color photoresist layer.

3. The liquid crystal display device as claimed in claim 2, wherein the metal signal lines includes multiple scan lines and multiple signal lines, and each of the scan lines and each of the signal lines are crossed perpendicularly with each other; a gate and a source of each of the thin-film-transistor units are respectively connected to one of the scan lines and one of the signal lines, and a drain thereof is connected to one of the pixel electrodes.

4. The liquid crystal display device as claimed in claim 3, wherein the transparent conductive material correspondingly covers the scan lines or the signal lines or concurrently covers the scan lines and the signal lines.

\* \* \* \* \*